United States Patent [19]
Yonemoto et al.

[11] Patent Number: 5,194,751
[45] Date of Patent: Mar. 16, 1993

[54] STRUCTURE OF SOLID-STATE IMAGE SENSING DEVICES

[75] Inventors: Kazuya Yonemoto, Tokyo; Tetsuya Iizuka, Kanagawa; Kazushi Wada, Kanagawa; Koichi Harada, Kanagawa; Michio Yamamura, Kanagawa, all of Japan

[73] Assignee: Sony Corporation, Japan

[21] Appl. No.: 825,333

[22] Filed: Jan. 27, 1992

Related U.S. Application Data

[63] Continuation of Ser. No. 552,540, Jul. 16, 1990, abandoned.

[30] Foreign Application Priority Data

Jul. 17, 1989 [JP] Japan .................................. 1-185045
Jul. 20, 1989 [JP] Japan .................................. 1-188558

[51] Int. Cl.⁵ ...................... H01L 29/78; H01L 27/02; H01L 27/14
[52] U.S. Cl. .................................. 257/229; 257/231; 257/245; 257/250; 358/213.29
[58] Field of Search .................. 357/242 R, 24 R, 24; 377/60, 63; 358/213.22, 213.23, 213.29

[56] References Cited

U.S. PATENT DOCUMENTS

| | | | |
|---|---|---|---|
| 4,230,954 | 1/1980 | Heller | 357/24 |
| 4,733,302 | 3/1988 | Kim-shita et al. | 357/24 L R |
| 4,754,311 | 6/1988 | Davids et al. | 357/24 |
| 4,774,586 | 9/1988 | Koiki et al. | 357/24 L R |
| 4,803,710 | 2/1987 | Elabd | 357/24 L R |
| 4,903,284 | 2/1990 | Esser | 357/24 L R |

FOREIGN PATENT DOCUMENTS

| | | | |
|---|---|---|---|
| 0127223 | 5/1984 | European Pat. Off. | |
| 2564674 | 11/1985 | France | 357/24 |
| 54-121088 | 9/1979 | Japan | 357/24 L R |
| 56-87379 | 7/1981 | Japan | 357/24 L R |
| 60-38869 | 2/1985 | Japan | |
| 63-9153 | 1/1988 | Japan | 357/24 |
| 63-217659 | 9/1988 | Japan | 357/24 |
| 63-254766 | 10/1988 | Japan | 357/24 |

OTHER PUBLICATIONS

Patent Abstracts of Japan, vol. 12, No. 369 (E-665)[3216], Oct. 4, 1988; & JP-A-63 120 463 (Matsushita Electric Ind. Co., Ltd.) May 24, 1988.

Primary Examiner—Andrew J. James
Assistant Examiner—Ngan Van Ngo
Attorney, Agent, or Firm—Ronald P. Kananen

[57] ABSTRACT

A structure of a solid-state image sensing device applicable to an HDVS is disclosed in which at least one of the transmission paths for the drive pulses used for driving vertical registers and horizontal registers can achieve reduced propagation delays and signal distortions of the drive pulses. In the first preferred embodiment, a control gate for controlling the transfer of signal charges between the horizontal registers is constituted by a first polycrystalline silicon layer, a metal wiring layer is formed and is connected to the first polycrystalline silicon layer via contact regions and transfer electrodes provided for driving the horizontal registers are constituted by second and third semiconductor layers placed between the first polycrystalline silicon layer and the metal wiring layer without contacting the contact regions. In the second preferred embodiment, the control gate is formed of a wiring layer placed above the semiconductor layers constituting the transfer electrodes of the horizontal registers. In the third preferred embodiment, shunt wiring films are formed independently on the transfer electrodes for the vertical registers of an image portion and on the transfer electrodes for those of a storage portion.

11 Claims, 3 Drawing Sheets

STRUCTURE OF SOLID-STATE IMAGE SENSING DEVICES

This application is a continuation of application Ser. No. 07/552,540 filed Jul. 16, 1990 now abandoned.

BACKGROUND OF THE INVENTION (1) Field of the Invention

The present invention relates to a structure of a solid-state image sensing device in which signal charges generated by a plurality of photo receiving elements arranged in a matrix form are transferred in a vertical direction by means of a plurality of vertical registers and the signal charges transferred by means of the plurality of vertical registers are partially transferred by means of a plurality of horizontal registers.

(2) Background of the Art

It becomes necessary to provide a high resolution for solid-state image sensing devices commonly used as photographing means in video cameras in order to meet requirements for highly resolved video cameras. Specifically, the number of pixels (constituted by the photo receiving elements) arranged in a matrix form must be increased. Although the number of pixels in the solid-state image sensing device of a commercially available video camera are about 300 thousand through 400 thousand about 2,000,000 pixels are required in the case of the video camera applicable to an HDTV (High Definition Television) since the resolution is five times higher than that in the comercially available video camera.

In addition, since an increase in the size of a chip in proportion to the increase in the number of pixels is not allowed, the number of pixels must be remarkably increased with no increase in the chip size.

Since a limit of the number of pixels aligned in a horizontal direction is generally determined according to a unit length of one bit of a horizontal register with the chip size of the solid-state image sensing device constant, this horizontal register provides a factor for restricting the high resolution of the image sensing device.

A Japanese Patent Application Second Publication (Examined) No. Heisei 1-13676 published on Mar. 7, 1989 exemplifies the structure of the solid-state image sensing device in which a plurality of horizontal registers are arranged in parallel to one another and signal charges generated by means of the photo receiving elements and transferred in the vertical direction by means of the vertical registers are shared and distributed into a plurality of horizontal registers so that an improvement in integrations of the pixels in the horizontal direction can be achieved.

A result of study on the solid-state image sensing devices in which the horizontal registers are installed is published in the paper of Television Society Vol. 41, No. 11 (published in 1987) titled as "Super High Resolution CCD Image Sensor" of pages 74 to 80.

One previously proposed solid-state image sensing device includes: a photo receiving portion in which photo receiving elements are arranged in the matrix form; a storage portion located below the photo receiving portion; a gate region located at a side of the storage portion opposite to the photo receiving portion, the gate region transferring signal charges to a first horizontal register at the same time when receiving a gate voltage.

The first horizontal register is arranged at a side of the gate region opposite the storage portion. A control gate is arranged at a side of the first horizontal register opposite the gate region. A second horizontal register is arraged at a side of the control gate opposite the first horizontal register. A multiplexor is provided for multiplexing the signal charges derived from the first and second horizontal registers.

The control gate transfers signal charges transferred from any other vertical registers which do not correspond to respective channel stoppers provided at every other interval along the control gate to the second horizontal register.

In addition, the control gate is formed by a first layer of a polycrystalline silicon layer. The polycrystalline silicon layer is located above an insulating film formed on a main surface of a semiconductor substrate.

It is noted that an interlayer insulating film encloses the control gate and the transfer electrodes are formed so as to intersect the control gate via the interlayer insulating film. The transfer electrodes serve to drive the horizontal registers. The transfer electrodes for the horizontal registers are arranged so that the second and third polycrystalline silicon layers are alternately arranged in the horizontal direction. One of the transfer electrodes constituted by one of the polycrystalline silicon layers receives a pulse $\phi_1$ and the other transfer electrode constituted by the other polycrystalline silicon layer receives a pulse $\phi_2$.

Since the previously proposed solid-state image sensing device applicable to an HDVS is provided with the control gate having a relatively long length of, e.g., about 15 mm, an application of a gate voltage $\phi_{HP}$ to the control gate is carried out from both ends of the control gate in order to reduce the propagation delay time of the control signal transmitted thereto to as small as possible.

However, since a specific resistance (resistivity) of the polycrystalline silicon layer is never low and therefore an equivalent circuit of a transmission path of the gate voltage is constituted by a plurality of R-C circuits, a waveform of the gate voltage $\phi_{HP}$ is distorted at the control gate and/or its amplitude becomes reduced. In this way, when a time constant of the transmission path becomes large, the propagation delay occurs and gives an ill effect on the operating characteristics of the control gate.

Especially, since the transfer of the signal charges toward the horizontal registers by means of the control gate must be carried out within a very short horizontal blanking interval in a television system of HDVS (High Definition Video System), such a propagation delay as described above cannot be neglected any more.

SUMMARY OF THE INVENTION

It is, therefore, an object of the present invention to provide a structure of a solid-state image sensing device in which at least one of drive pulse transmission paths of a control gate for controlling the transfer of signal charges from vertical registers toward horizontal registers in synchronization with first drive pulses and of transfer electrodes provided for driving vertical registers to transfer signal charges generated in a plurality of photo receiving elements can achieve reduced drive pulse signal propagation delays and reduced signal distortions.

This can be achieved by providing a structure of a solid-state image sensing device, comprising; (a) a plurality of photo receiving elements arranged in a matrix form; (b) a plurality of vertical registers, having transfer electrodes, for transferring signal charges generated in the photo receiving elements toward a vertical direction thereof in synchronization with first drive pulses; (c) a plurality of horizontal registers, having transfer electrodes, for transferring the signal charges transferred by the vertical registers toward a horizontal direction thereof, sharing the signal charges with respective thereof; (d) a control gate for controlling the transfer of signal charges between the horizontal registers in synchronization with second drive pulses; and (e) means for reducing a specific resistance along at least one transmission path of both first and second drive pulses.

This can also be achieved by providing a structure of a solid-state image sensing device, comprising: (a) a plurality of photo receiving elements arranged in a matrix form; (b) a plurality of vertical registers, having transfer electrodes, for transferring signal charges generated in the photo receiving elements toward a vertical direction thereof in synchronization with first drive pulses; (c) a plurality of horizontal registers, having transfer electrodes, for transferring the signal charges transferred by the vertical registers toward a horizontal direction thereof, sharing the signal charges with respective thereof; (d) a control gate for controlling the transfer of signal charges between the horizontal registers in synchronization with second drive pulses; and (e) means for reducing a specific resistance along each of the transmission paths of both first and second drive pulses.

BRIEF DESCRIPTION OF THE DRAWINGS

FIG. 3 (B) is an equivalent circuit diagram of FIG. 3 (A).

DETAILED DESCRIPTION OF THE PREFERRED EMBODIMENTS

Reference will hereinafter be made to the drawings in order to facilitate a better understanding of the present invention.

FIGS. 1 through 3(B) show a first preferred embodiment of a structure of a solid-state image sensing device.

Figure 1:
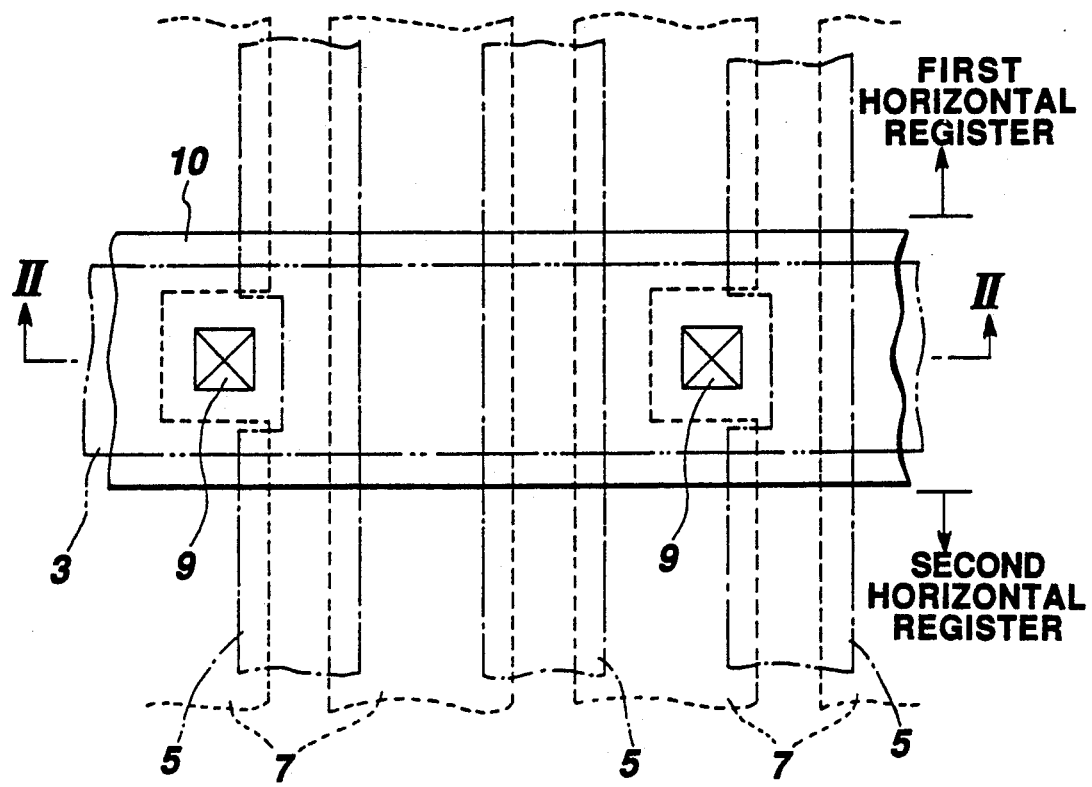
FIG. 1 is a schematic elevational view of an internal structure of an image sensing device in a first preferred embodiment according to the present invention.
Figure 2:
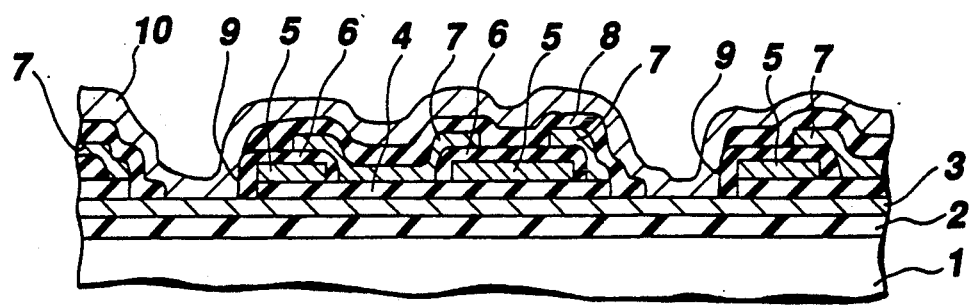
FIG. 2 is a cross sectional view cut away along the line of II—II of FIG. 1.
Figure 3:
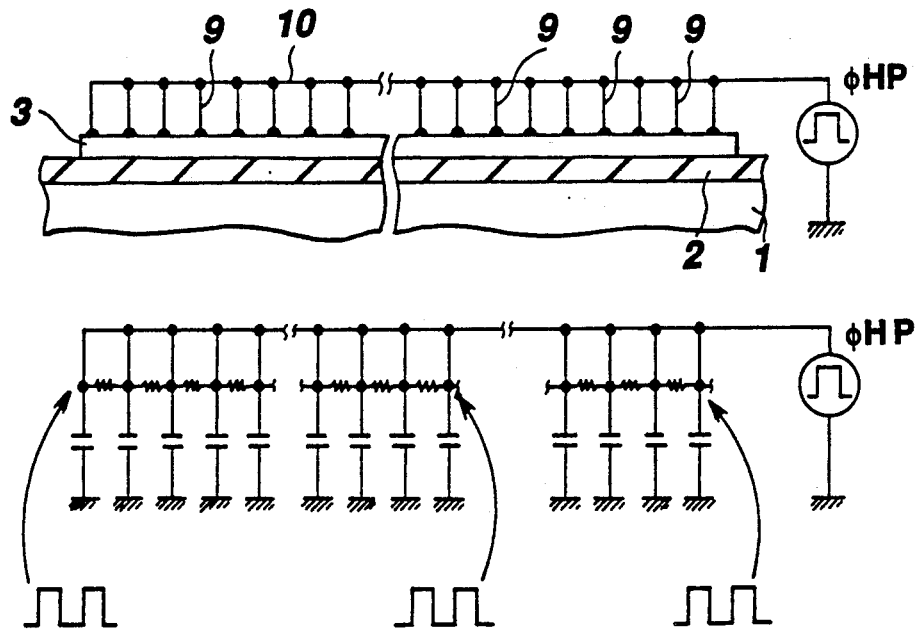
FIG. 3 (A) is a circuit wiring diagram of a control gate in the first preferred embodiment shown in FIGS. 1 and 2.

In the drawings of FIGS. 1 and 2, a semiconductor substrate 1 is located below an insulating film constituted by $SiO_2$ (silicon dioxide). A first polycrystalline silicon layer 3 is formed on the surface of the $SiO_2$ insulating layer. A plurality of interlayer insulating layers 4 are formed on the control gate 3. A plurality of transfer electrodes 5 for driving horizontal registers constituted by second polycrystalline silicon layers are formed on the respective interlayer insulating layers 4. A plurality of interlayer insulating layers 6 are formed so as to enclose the respective transfer electrodes 5. A plurality of other transfer electrodes 7 for driving the horizontal registers are formed on the interlayer insulating layers 6.

In addition, as shown in FIG. 2, numeral 8 denotes a plurality of interlayer insulating layers, numerals 9, 9,—denotes contact regions through which the control gate 3 is partially exposed, numeral 10 denotes a metal wiring layer, constituted by, e.g., aluminium, connecting the control gate 3 to the contact regions 9, 9.

In the first preferred embodiment, the control gate 3 for controlling signal charge transfer between two horizontal registers is constituted by the first polycrystalline silicon layer. The transfer electrodes 5, 7, 5, 7, —controlling the two horizontal registers are formed by the second and third polycrystalline silicon layers. Then, the metal wiring layer 10 which serves as a shunt wire intended to lower a specific resistance for the control gate 3 is placed on a layer up from the third polycrystalline silicon layers 7, 7, 7,—. The contact regions 9, 9,—serve as contacts between the metal wiring layer 10 and control gate 3.

The second and third polycrystalline silicon layers 5, 5, 7, 7,—constituted by the horizontal register driving transfer electrodes are formed so as to avoid contact against the contact regions 9, 9,—in order to avoid occurrence of short-circuiting.

FIGS. 3(A) and 3(B) show circuit wiring diagram of the control gate 3 and its equivalent circuit.

Since the metal wiring layer 10, e.g., constituted by aluminium having a sheet resistance much lower than the control gate 3 (one-thousandth or lower) is connected in parallel to one another as a shunt wiring form, a time constant of a transmission path of a gate voltage $\phi_{HP}$ is extremely small. Hence, since the propagation delay can be remarkably reduced, it is possible for the image sensing device to be applied to an HDVS (High Definition Video System).

Figure 4:
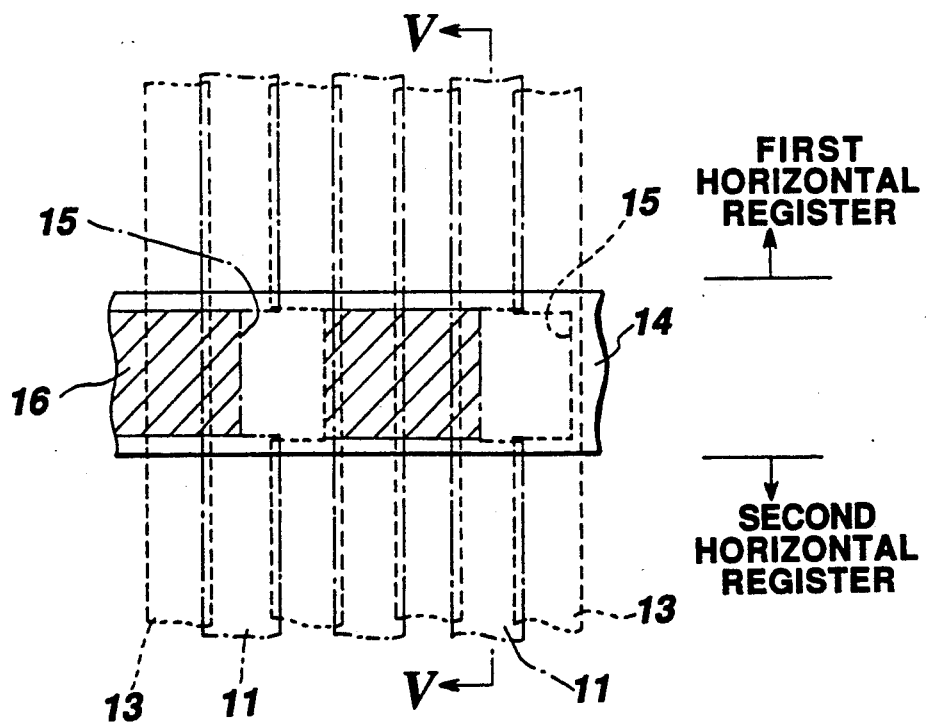
FIG. 4 is a schematic elevational view of an internal circuit of the structure of the image sensing device in a second preferred embodiment according to the present invention.
Figure 5:
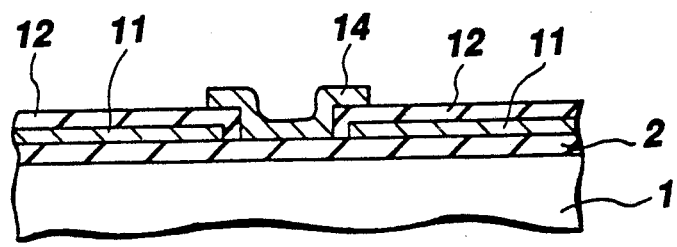
FIG. 5 is a cross sectional view cut away along the line of V—V of FIG. 4.

FIGS. 4 and 5 show a second preferred embodiment of the structure of the image sensing device.

In FIGS. 4 and 5, numerals 11, 11, 11,—denote transfer electrodes for driving storage portions of the horizontal registers and are constituted by the first polycrystalline silicon layer. Numeral 12 denotes the interlayer insulating film. Numerals 13, 13,—denote transfer electrodes for driving the transfer portion of the horizontal registers and are constituted by the second polycrystalline silicon layer. Numeral 14 denotes the control gate for controlling the signal charge transfer between the horizontal registers, the control gate being placed on an upper portion of the first and second layers of the polycrystalline silicon layers and is constituted by polyside. The control gate 14 is opposed to the semiconductor substrate 1 via the insulating layer via regions 15, 15,—cut out partially along the polycrystalline silicon layers 11, 12, 11, 12. The control gate 14 controls the transfers of signal charges between the two horizontal registers. Channel stops (denoted by oblique lines) 16, 16, 16,—are arranged between the respective regions 15, 15 controlling the surface of the semiconductor substrate 1.

In the second preferred embodiment, since the control gate 14 is constituted by the polyside, the specific resistance along the control gate 14 can be reduced as compared with the conventional one which is merely constituted by the polycrystalline silicon. Hence, the time constant of the signal transmission path through which the gate voltage $\phi_{HP}$ is applied can become small.

It is noted that since the control gate 14 is placed at an upper layer of the transfer electrodes 11, 13 for driving the horizontal registers, the control gate 14 may be formed with the third polycrystalline silicon layer and the metal wiring layer constituted by, e.g., aluminium and which provides a shunt wiring for the upper layer of the control gate 14 may be formed so that the contact regions serve to connect between the metal wiring layer and control gate 14 in order to reduce the specific resistance of the control gate.

Figure 6:
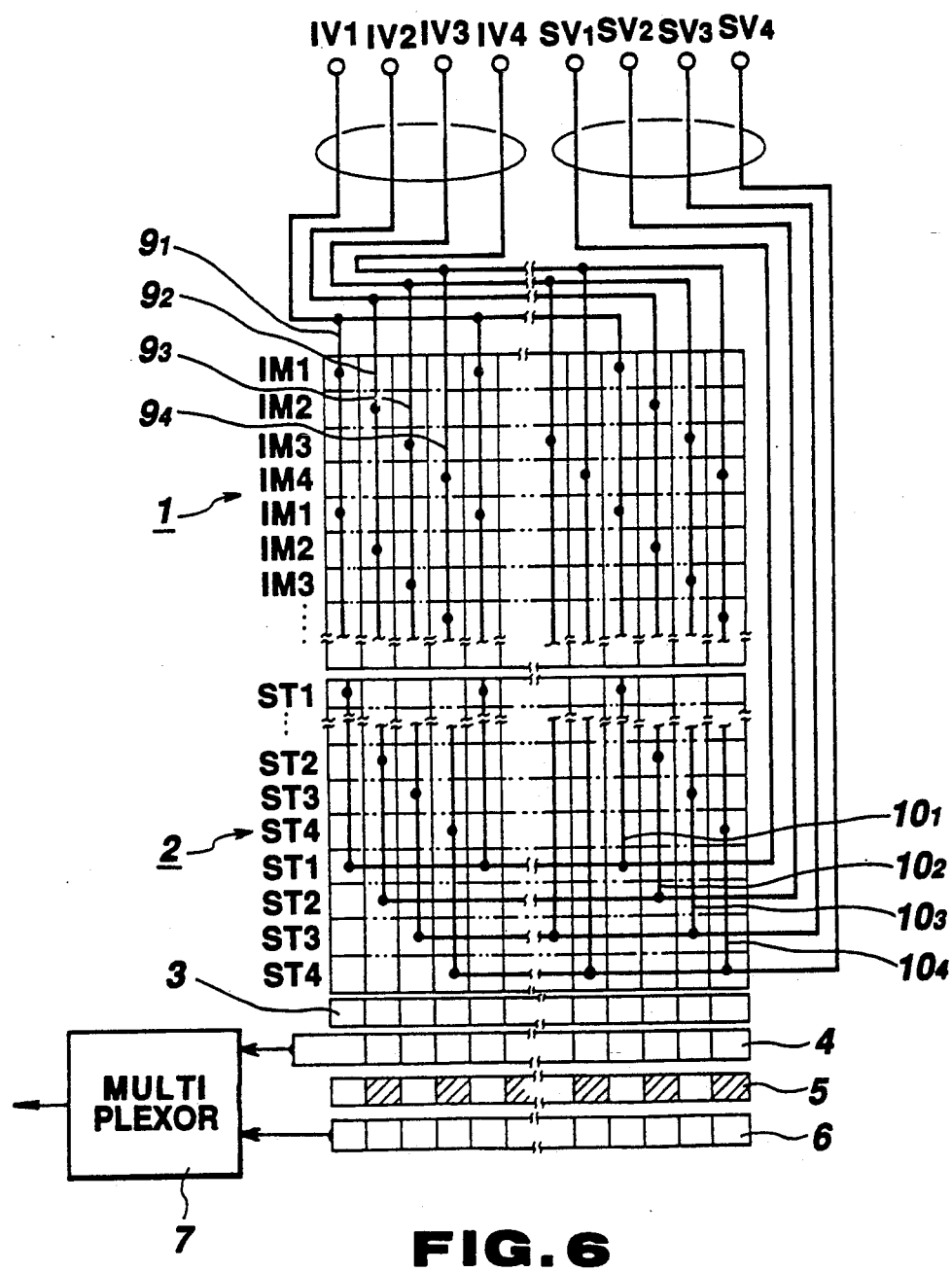
FIG. 6 is a schematic elevational view of the structure of the image sensing device in a third preferred embodiment according to the present invention.

FIG. 6 shows a third preferred embodiment of the structure of the image sensing device.

In the third preferred embodiment, a solid-state frame interline type (FIT) image sensing device includes: an image portion having a plurality of photo receiving elements arranged in the matrix form and a plurality of vertical registers, installed so as to correspond to respective vertical rows of the photo receiving elements, for transferring signal charges stored in the photo receiving elements in the vertical direction; and a storage portion, placed at the vertical transferred portion of the image portion, having a plurality of vertical registers temporarily storing the signal charges generated at the image portion.

Shunt wiring films are formed independently on the transfer electrodes of the vertical registers of the image portion and on the transfer electrodes of the vertical registers of the storage portion, respectively. The drive pulses are applied to the transfer electrodes corresponding to the shunt wiring films.

The transfer electrodes are controlled by means of a quadraple drive pulse and are constituted by IM1, IM2, IM3, IM4, IM1, IM2, IM3, IM4, —.

In FIG. 6, numerals $9_1$ through $9_4$ denote shunt wiring films for the transfer electrodes IM1 through IM4 of the respective vertical registers of the image portion 1 and do not extend toward the storage portion 2. An origin of the shunt wiring films $9_1$ through $9_4$ is placed on the upper side of the image portion 1. The drive pulses IV1 through IV4 are applied to the respective transfer electrodes IM1 through IM4 of the image portion 1 via the image bus lines sequentially in orders from upper side.

Numerals $10_1$ through $10_4$ denote shunt wiring films for the respective transfer electrodes ST1 through ST4 of the storage portion 2. The shunt wiring films receive drive pulses SV1 through SV4 for the vertical registers within the storage portion 2 via the bus line from the lower side and transferring the drive pulses via the transfer electrodes ST1 through ST4.

Since, in the third preferred embodiment, the shunt wiring films $9_1$ through $9_4$ of the image portion 1 and those $10_1$ through $10_4$ are mutually separated so as to operate independently of each other, a coupling capacitance across both image portion 1 and storage portion 2 is substantially reduced by half. Hence, a burden imposed on a clock generator which generates the drive pulses can be reduced, distortions in the drive pulses can be reduced and deteriorations in the operating characteristics in the image sensing device can be prevented.

Although the drive pulses are transmitted to upper portions of the shunt wiring films $9_1$ through $9_4$ of the image portion 1 and to the lower portions of the shunt wiring films $10_1$ through $10_4$ of the storage portion 2, the drive pulses may be transmitted to upper and lower end portions of both shunt wiring films $9_1$ through $9_4$ and shunt wiring films $10_1$ through $10_4$.

It is noted that a combination of the first or second preferred embodiment with the third preferred embodiment can be applied to the solid-state image sensing device according to the present invention.

As described above, since in the solid-state image sensing device according to the present invention, the specific resistance of the signal transmission path of the drive pulses can be reduced, the drive pulse signal propagation delays in the solid-state image sensing device can be remarkably reduced and operating characteristics thereof can be improved. Thus, the solid-state image sensing device according to the present invention can be applied to HDVS.

It will fully appreciated by those skilled in the art that the foregoing description has been made in terms of the preferred embodiments and various changes and modifications may be made without departing from the scope of the present invention which is to be defined by the appended claims.

What is claimed is:

1. A solid-state frame interline type imager comprising:
   (a) an image portion comprising a plurality of photo receiving elements arranged in a matrix form and a plurality of first vertical registers having first transfer electrodes for transferring in the vertical direction signal charges read out from the plurality of photo receiving elements;
   (b) a storage portion comprising a plurality of second vertical registers having second transfer electrodes for temporarily storing the signal charges transferred from the image portion;
   (c) at least one horizontal register having third transfer electrodes for transferring the signals charges from said storage portion in the horizontal direction;
   (d) first shunt wirings formed independently on the first transfer electrodes in an orthogonal direction to said first transfer electrodes and connected to said first transfer electrodes through a plurality of first contact regions through which said first transfer electrodes are partially exposed and said first shunt wirings are connected to each other so that first drive pulses are applied to the first transfer electrodes; and
   (e) second shunt wirings provided separately from said first shunt wirings and formed independently on the second transfer electrodes in an orthogonal direction to said second transfer electrodes and connected to said second transfer electrodes through a plurality of second contact regions through which said second transfer electrodes are partially exposed and said second shunt wirings are connected to each other so that second drive pulses are applied to the second transfer electrodes.

2. An imager as set forth in claim 1, wherein said at least one horizontal register comprises a plurality of horizontal registers, said imager further comprising:
   a control gate for controlling the transfer or signal charges between said horizontal registers in synchronization with said second drive pulses; and
   means for reducing a specific resistance along at least one of the transmission paths for the first and second drive pulses.

3. An imager as set forth in claim 2, wherein the specific resistance reducing means comprises the control gate formed by a first semiconductor layer located on a semiconductor substrate surface at a first layer portion; a metal wiring layer connected to the first semiconductor layer via contact regions; and the third transfer electrodes comprised of second and third semiconductor layers located between said metal wiring layer and said first semiconductor layer without contacting said contact regions.

4. An imager as set forth in claim 2, wherein the specific resistance reducing means comprises said third transfer electrodes comprised of semiconductor layers having different layers and said control gate formed with a wiring layer placed above said semiconductor layers of said third transfer electrodes.

5. An imager as set forth in claim 4, wherein said semiconductor layers of said third transfer electrodes are comprised of first and second layers placed on an upper surface of a semiconductor substrate.

6. An imager as set forth in claim 3, wherein said first semiconductor layer is formed of a polycrystalline silicon layer, said first transfer electrodes are formed of polycrystalline silicon layers sandwiched with an interlayer insulating layer, and the metal wiring layer is formed of a metal having a sheet resistance much lower than that for the control gate.

7. An imager as set forth in claim 6, wherein said metal wiring layer is formed of aluminum.

8. An imager as set forth in claim 4, wherein said third transfer electrodes are formed of a first layer of polycrystalline silicon and of a second layer of polycrystalline silicon, the control gate is formed of a polyside placed above said first and second layers of polycrystalline silicon and the control gate opposes a semiconductor substrate at regions where the polycrystalline silicon layers are partially cut out.

9. A structure as set forth in claim 8, wherein a metal wiring layer is formed on a portion above said control gate and contact regions are placed between the metal wiring layer and control gate so as to form a connection therebetween.

10. A structure set forth in claim 4, wherein said specific resistance reducing means includes first shunt wiring films provided for said first transfer electrodes, said first drive pulses are supplied to the respective first vertical registers via an image bus and said first shunt wiring films, and second shunt wiring films provided for said second transfer electrodes, said second drive pulses are supplied to the respective second vertical registers of the storage portion via a storage bus and said second shunt wiring films.

11. An imager as set forth in claim 1, wherein said at least one horizontal register comprises a plurality of horizontal registers, said imager further comprising:
 a control gate for controlling the transfer of signal charges between the horizontal registers in synchronization with said second drive pulses; and
 means for reducing a specific resistance along each of the transmission paths for the first and second drive pulses.

* * * * *